(12) United States Patent
Malek et al.

(10) Patent No.: US 8,913,390 B2
(45) Date of Patent: Dec. 16, 2014

(54) THERMALLY CONDUCTIVE PRINTED CIRCUIT BOARD BUMPERS

(75) Inventors: Shayan Malek, San Jose, CA (US); Michael B. Wittenberg, Sunnyvale, CA (US); Miguel C. Christophy, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 226 days.

(21) Appl. No.: 13/536,890

(22) Filed: Jun. 28, 2012

(65) Prior Publication Data

US 2014/0002996 A1  Jan. 2, 2014

(51) Int. Cl.
*H05K 7/20* (2006.01)

(52) U.S. Cl.
USPC ...... 361/714; 361/679.54; 361/704; 361/707; 361/709; 361/715; 165/80.2; 165/104.33; 174/252

(58) Field of Classification Search
USPC .......... 361/679.46, 679.54, 679.55, 704–715, 361/719–722, 816, 818; 165/80.2, 80.3, 165/104.33, 185; 257/706, 707, 712, 714, 257/720; 174/15.1, 16.3, 252
See application file for complete search history.

(56) References Cited

U.S. PATENT DOCUMENTS

| | | | | |
|---|---|---|---|---|
| 4,661,888 A * | 4/1987 | Jewell et al. | | 361/818 |
| 4,994,937 A * | 2/1991 | Morrison | | 361/715 |
| 5,175,613 A * | 12/1992 | Barker et al. | | 257/713 |
| 5,880,930 A * | 3/1999 | Wheaton | | 361/690 |
| 5,956,576 A * | 9/1999 | Toy et al. | | 438/125 |
| 6,094,349 A * | 7/2000 | Fassel et al. | | 361/704 |
| 6,195,267 B1 * | 2/2001 | MacDonald et al. | | 361/800 |
| 6,577,504 B1 * | 6/2003 | Lofland et al. | | 361/709 |
| 6,947,286 B2 | 9/2005 | Belady et al. | | |
| 6,972,963 B1 | 12/2005 | Chou | | |
| 7,463,496 B2 * | 12/2008 | Robinson et al. | | 361/818 |
| 7,495,226 B2 * | 2/2009 | Jadrich et al. | | 250/370.09 |
| 7,796,391 B2 * | 9/2010 | Fischer et al. | | 361/707 |
| 8,154,864 B1 | 4/2012 | Nearman et al. | | |
| 8,179,236 B2 | 5/2012 | Weller et al. | | |
| 2006/0261467 A1 * | 11/2006 | Colgan et al. | | 257/707 |
| 2007/0013053 A1 * | 1/2007 | Chou et al. | | 257/706 |
| 2009/0091888 A1 * | 4/2009 | Lin et al. | | 361/704 |

FOREIGN PATENT DOCUMENTS

| | | |
|---|---|---|
| EP | 2262354 | 12/2010 |
| WO | 0004752 | 1/2000 |

* cited by examiner

*Primary Examiner* — Michail V Datskovskiy
(74) *Attorney, Agent, or Firm* — Treyz Law Group; G. Victor Treyz; Jason Tsai (57) ABSTRACT

An electronic device may have electrical components that generate heat. The components may be mounted on a printed circuit board having a peripheral edge with an edge surface. The edge surface may be coated with a layer of metal. Metal traces in the printed circuit board such as ground plane traces may be used to conduct heat from the electrical components to the layer of metal on the edge surface. The edge surface may be separated from an adjacent thermally conductive electronic device housing structure by an air gap. Thermally conductive elastomeric bumper structures may bridge the air gap between the edge surface of the printed circuit and the housing structure. The thermally conductive elastomeric bumper structures may conduct heat from the layer of metal on the edge surface to the housing structure and may serve as a cushioning interface between the printed circuit and the housing structure.

16 Claims, 9 Drawing Sheets

THERMALLY CONDUCTIVE PRINTED CIRCUIT BOARD BUMPERS

BACKGROUND

This relates to electronic devices and, more particularly, to thermal and shock management features for electronic devices.

Electronic devices such as cellular telephones and other portable devices are often provided with components such as integrated circuits. During operation of an electronic device, these components may generate heat. A heat sink may be placed on top of a component such as an integrated circuit to help cool the component, but this can add undesirable bulk to a system or may be insufficient to completely cool a component. Printed circuit boards with components may also be subjected to damage during drop events.

It would therefore be desirable to be able to provide improved structures for cooling components and for preventing components from being damaged during impact events.

SUMMARY

An electronic device may have electrical components that generate heat such as integrated circuits. The components may be mounted on a printed circuit board. The printed circuit board may have signal lines formed from one or more layers of metal traces. The metal traces may include ground plane layers.

The printed circuit board may have a peripheral edge with an edge surface. The edge surface may be coated with a layer of metal. The metal traces in the printed circuit board such as the ground plane layers may be coupled to the metal layer on the edge surface. As heat is produced by the integrated circuits and other components on the printed circuit board, the ground plane traces and other metal traces may conduct heat from the components to the layer of metal on the edge surface.

The edge surface of the printed circuit board may be separated from adjacent thermally conductive electronic device housing structures by an air gap. The thermally conductive electronic device housing structures may include a metal housing wall.

Thermally conductive elastomeric bumper structures may be formed between the edge surface of the printed circuit and the housing structures, bridging the air gap. The thermally conductive elastomeric bumper structures may conduct heat from the layer of metal on the edge surface to the housing structures and may serve as a cushioning interface between the printed circuit and the housing structures.

Further features of the invention, its nature and various advantages will be more apparent from the accompanying drawings and the following detailed description of the preferred embodiments.

DETAILED DESCRIPTION

Components such as integrated circuits and other electrical components can be mounted on substrates such as printed circuit boards. The printed circuit boards may be mounted in electronic device housings.

To ensure that the components on a printed circuit are not damaged during a drop event, elastomeric bumper structures may be used to mount a printed circuit within an electronic device housing.

Integrated circuits and other electrical components generate heat. To help remove the heat, the bumper structures that are used to mount the printed circuit board to the device housing may be formed from a thermally conductive material. A layer of metal on the edge of the printed circuit board and metal traces such as ground plane traces in the printed circuit board may also be used in dissipating heat.

Figure 1:
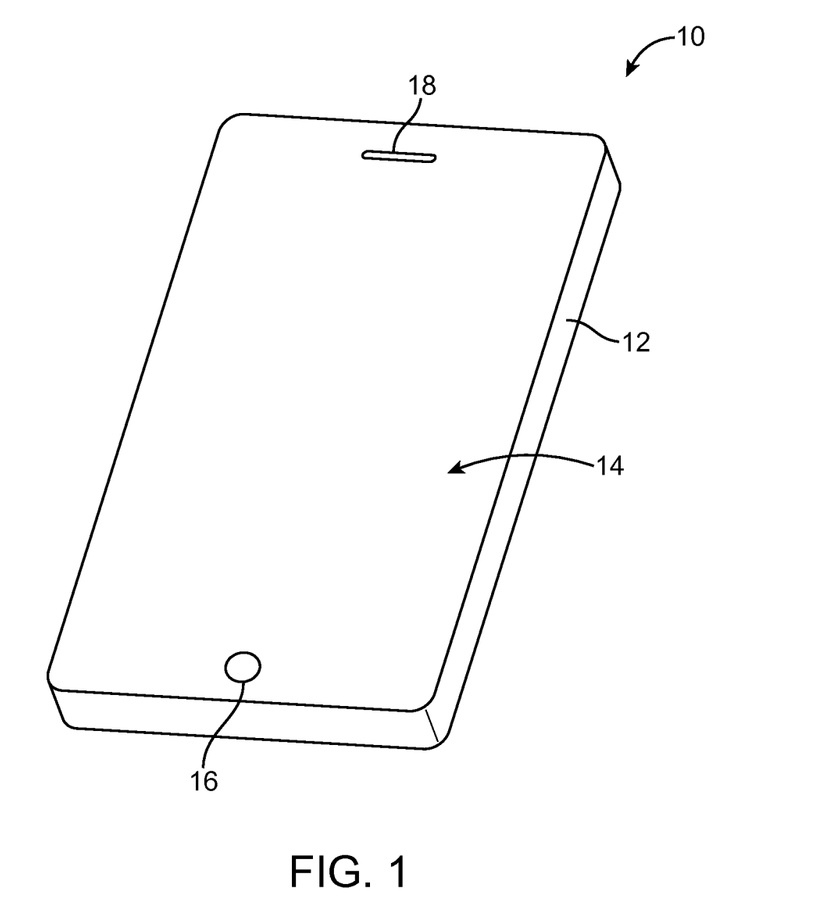
FIG. 1 is a front perspective view of an illustrative electronic device of the type that may be provided with thermally conductive bumper structures in accordance with an embodiment of the present invention.

An illustrative electronic device of the type that may be provided with a printed circuit board that is mounted in an electronic device housing using thermally conductive bumper structures is shown in FIG. 1. Device 10 of FIG. 1 may be a handheld device such as a cellular telephone or media player, a tablet computer, a notebook computer, other portable computing equipment, a wearable or miniature device such as a wristwatch or pendant device, a television, a computer monitor, or other electronic equipment. This equipment may include processors, memory, switches, sensors, wireless circuits, and other circuitry.

As shown in FIG. 1, electronic device 10 may include a display such as display 14. Display 14 may be a touch screen that incorporates a layer of conductive capacitive touch sensor electrodes or other touch sensor components or may be a display that is not touch-sensitive. Display 14 may include an array of display pixels formed from liquid crystal display (LCD) components, an array of electrophoretic display pixels, an array of electrowetting display pixels, or display pixels based on other display technologies.

Display 14 may be protected using a display cover layer such as a layer of transparent glass or clear plastic. Openings may be formed in the display cover layer. For example, an opening may be formed in the display cover layer to accommodate a button such as button 16 and an opening such as opening 18 may be used to form a speaker port. Device configurations without openings in display 14 may also be used for device 10.

Device 10 may have a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials.

Housing 12 may be formed using a unibody configuration in which some or all of housing 12 is machined or molded as a single structure or may be formed using multiple structures (e.g., an internal frame structure, one or more structures that form exterior housing surfaces, etc.).

Device 10 may include components such as processor integrated circuits, memory integrated circuits, application-specific integrated circuits, and other integrated circuits and electrical components. These components may be mounted on substrates such as printed circuit boards (e.g., fiberglass-filled epoxy substrates such as FR4 substrates).

Figure 2:
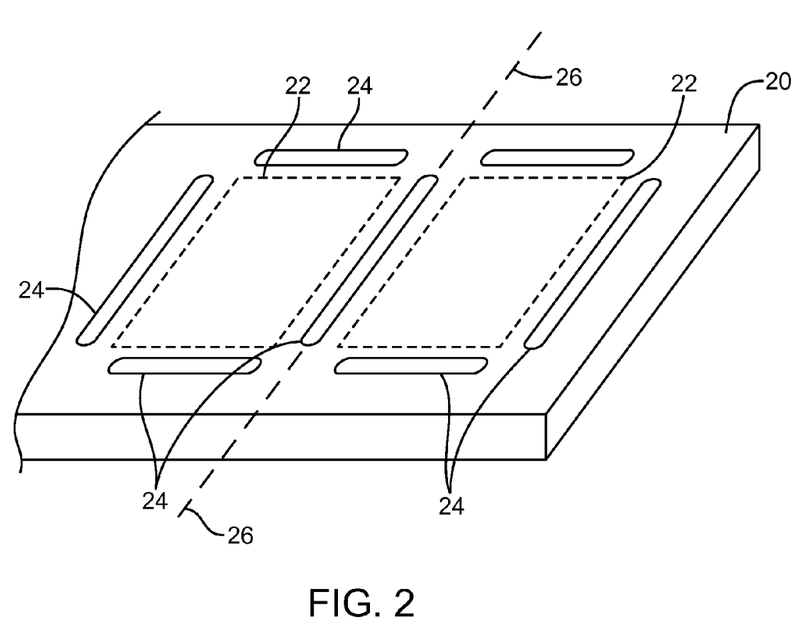
FIG. 2 is a perspective view of a printed circuit board panel in accordance with an embodiment of the present invention.

Printed circuit boards may be formed from panels of printed circuit board substrate material. An illustrative printed circuit board panel is shown in FIG. 2. As shown in FIG. 2, multiple printed circuit boards 22 may be formed within panel 20. Printed circuit boards 22 may contain metal traces (sometimes referred to as interconnects). The metal traces may include patterned horizontal signal lines and vias for routing signals between components that are mounted on the printed circuit boards. The metal traces may include ground plane structures (e.g., blanket sections of metal traces that serve as ground). There may be any suitable number of layers of metal in a printed circuit such as printed circuit boards 22 of FIG. 2. For example, printed circuit boards 22 may contain two layers of metal, three layers of metal, four layers of metal, or more than four or fewer than four layers of metal.

To promote heat transfer through the edges of printed circuits 22, the edges of printed circuits 22 may be coated with a layer of conductive material such as metal. As an example, grooves such as grooves 24 of FIG. 2 may be formed by machining or laser cutting of printed circuit board panel 20. The inner sides of grooves 24 may form vertical edge surfaces for the peripheral edges of printed circuit boards 22. Electroplating techniques or other metal deposition techniques may be used to coat the peripheral edges of printed circuit boards 22. Following metal coating of the edges or printed circuit boards 22, a saw or other cutting tool may be used to singulate boards 22 (e.g., by forming cuts through board 20 such as cut 26 of FIG. 2).

Figure 3:
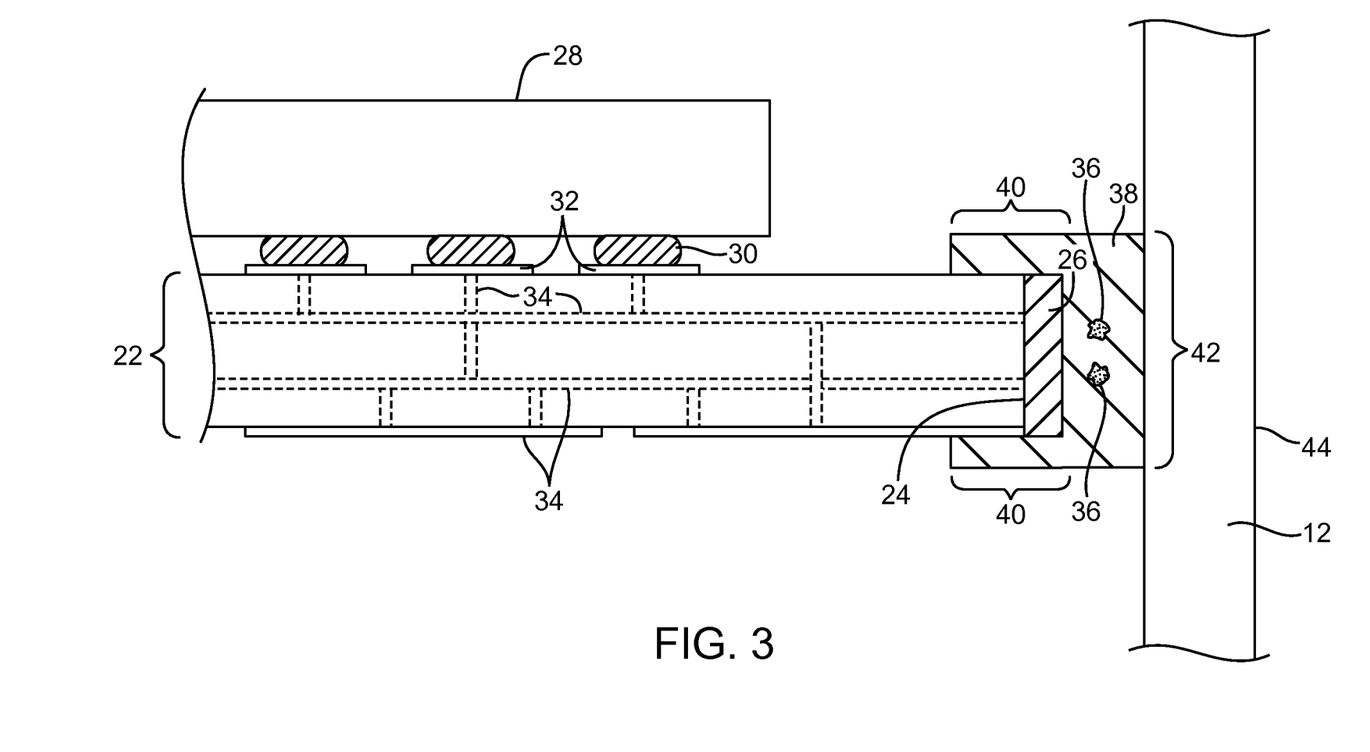
FIG. 3 is a cross-sectional side view of a portion of a printed circuit board with edge plating that has been mounted to a housing wall using thermally conductive bumper structures in accordance with an embodiment of the present invention.

A cross-sectional side view of printed circuit board 22 in which edge surface 24 of printed circuit board 22 has been coated with metal layer 26 is shown in FIG. 3. As shown in FIG. 3, electrical component 28 may be mounted to printed circuit board 22 using solder 32. Solder 32 may connect electrical paths in component 28 to traces in printed circuit 22 such as solder pads 32. Solder pads 32 may be connected to other traces in printed circuit board 22 such as traces 34. Traces 34 may include patterned signal lines, vias, and ground planes (as examples). At one or more peripheral edges of printed circuit 22 such as edge 24, traces 34 (e.g., ground plane traces) may be coupled to edge metal 26 to promote heat transfer.

Bumper structures 38 may have portions such as portions 40 that enclose the edge of printed circuit 22 (e.g., bumper structures 38 may have a C-shaped cross section). Bumper structures 38 may be formed from an elastomeric material such as silicone or other polymers (e.g., a polymer with a Shore A hardness of 70 or less, 60 or less, 50 or less, 65-45, or 45 or less). The use of elastomeric materials in forming bumper structures 38 may allow bumper structures 38 to absorb shocks during impact events in which device 10 is struck against an external object. Bumper structures 38 may, for example, keep edge 24 of printed circuit 22 from contacting the opposing inner surface of housing 12, thereby preventing printed circuit board 22 from becoming cracked.

A thermally conductive additive such as metal particles 36 may be incorporated into the silicone or other elastomeric polymer that is used in forming bumper structures 38. The thermally conductive additive may ensure that bumper structures 38 exhibit a satisfactory thermal conductivity for helping to transfer heat from component 28 to housing 12 (e.g., a metal housing wall). For example, thermally conductive additives may be incorporated into bumper structures 38 at a level sufficient to cause bumper structures 38 to exhibit a thermal conductivity of greater than 0.5 W/mK, greater than 1 W/mK, greater than 1.5 W/mK, greater than 2 W/mK, greater than 4 W/mK, 1-2 W/mK, 0.5-3 W/mK, greater than 10 W/mK or other suitable amount.

During operation, heat from component 28 may be conducted through solder 30, pads 32, and traces 34 to edge metal layer 26. From edge metal 26, elastomeric thermally conductive bumper structures 38 may conduct the heat to housing 12 along contact surface 42 between bumper structures 38 and housing 12. Housing 12 may be formed from one or more metal parts or other substances that exhibit a relatively high thermal conductivity (e.g., greater than 200 W/mK, as an example). Housing 12 may also have a relatively large surface area on exterior surface 44 that is exposed to the air surrounding device 10, allowing housing 12 to effectively serve as a large heat sink.

The portion of housing 12 that is contacted by thermally conductive bumper structures 38 may be a housing sidewall, may be part of a rear or front planar housing wall, may be part of an internal frame structure that is coupled to a housing wall, or other suitable housing structures. The housing structures that are contacted by thermally conductive bumper structures 38 may be formed from a thermally conductive material such as metal (e.g., aluminum, stainless steel, copper, or other metals) or other thermally conductive structures (e.g., fiber-based composites, etc.).

Figure 4:
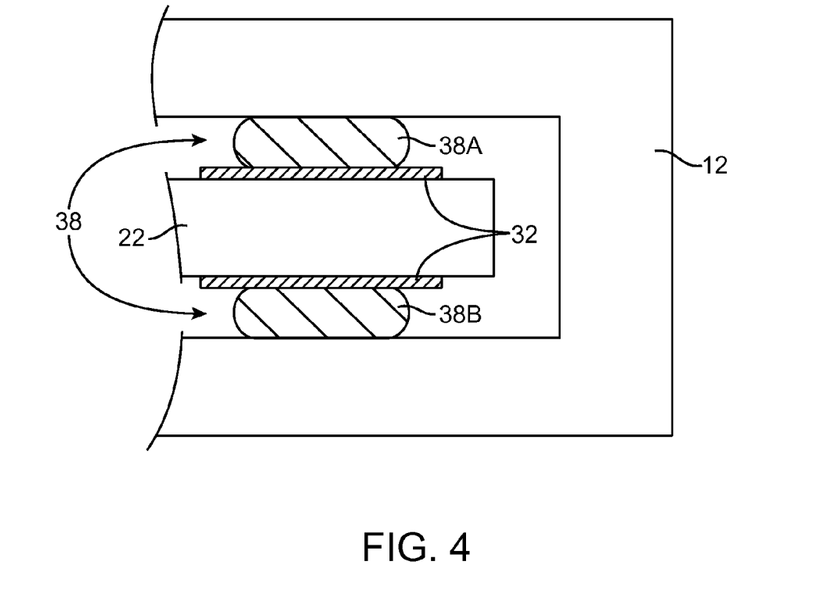
FIG. 4 is a cross-sectional side view of an illustrative printed circuit board with upper and lower pads that have been coupled to a housing wall using thermally conductive bumper structures in accordance with an embodiment of the present invention.

If desired, thermally conductive bumper structures 38 may be mounted between printed circuit 22 and adjacent upper and lower housing structures using pads on printed circuit 22 such as pads 32. This type of arrangement is shown in FIG. 4. As shown in FIG. 4, thermally conductive bumper structures 38 may include upper bumper structures 38A and lower bumper structures 38B. Upper bumper structures 38A may be used to couple pad 32 on the upper surface of printed circuit 22 to an upper housing wall of housing 12. Lower bumper structures 38B may be used to couple pad 32 on the lower surface of printed circuit 22 to a lower housing wall of housing 12. Pads 32 may be coupled to ground plane traces and other traces in printed circuit 22 to facilitate the flow of heat to thermally conductive bumper structures 38.

Figure 5:
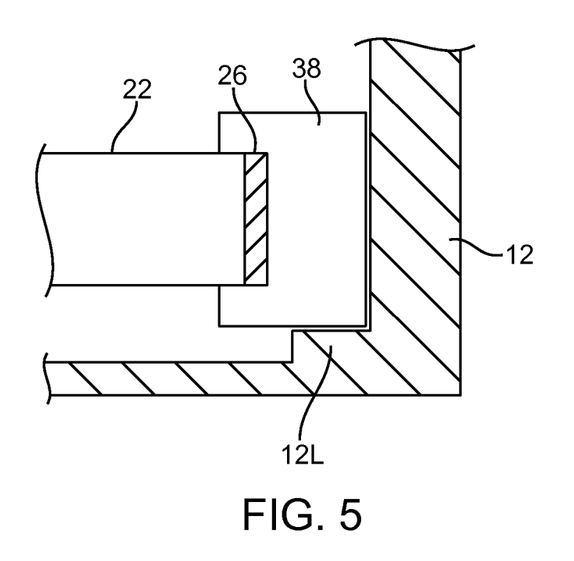
FIG. 5 is a cross-sectional side view of an edge portion of an illustrative printed circuit board coupled to a portion of a housing wall with a ledge in accordance with an embodiment of the present invention.

As shown in the illustrative configuration of FIG. 5, printed circuit board 22 may be coupled to housing 12 using thermally conductive bumper structures 38 resting on ledge portion 12L of housing 12. This type of arrangement, in which thermally conductive bumper structures 38 contact more than one surface of housing 12, may help facilitate heat transfer to housing 12 by enhancing the amount of contact surface area between thermally conductive bumper structures 38 and housing 12.

Figure 6:
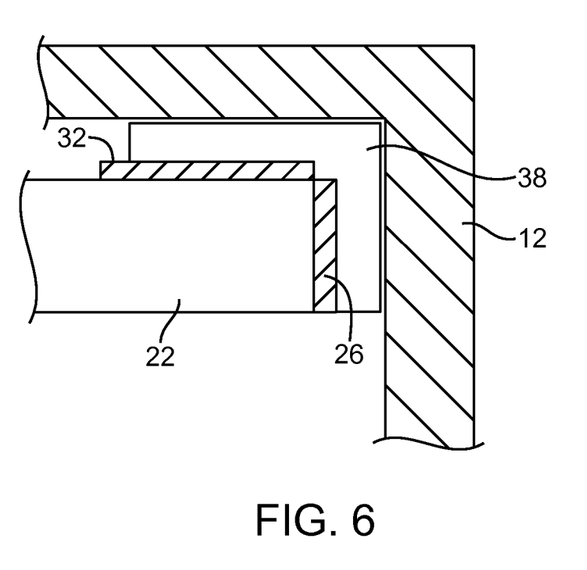
FIG. 6 is a cross-sectional side view of an edge portion of an illustrative printed circuit board coupled to a corner portion of a housing wall in accordance with an embodiment of the present invention.

As shown in FIG. 6, printed circuit board 22 may be coupled to a corner of housing 12 using thermally conductive bumper structures 38 that simultaneously form a thermal pathway between a surface pad on the upper surface of printed circuit 22 and an inner surface of a planar wall in housing 12 (e.g., an upper or lower housing wall) and between an edge conductor such as edge metal layer 26 and an inner surface of a side wall portion of housing 12. Thermally conductive bumper structures 38 of FIG. 6 may have an L-shaped cross section (as shown in FIG. 6) or may have other cross-sectional shapes (e.g., C-shaped cross sections, etc.). The L-shaped cross-sectional shape of FIG. 6 is merely illustrative.

Figure 7:
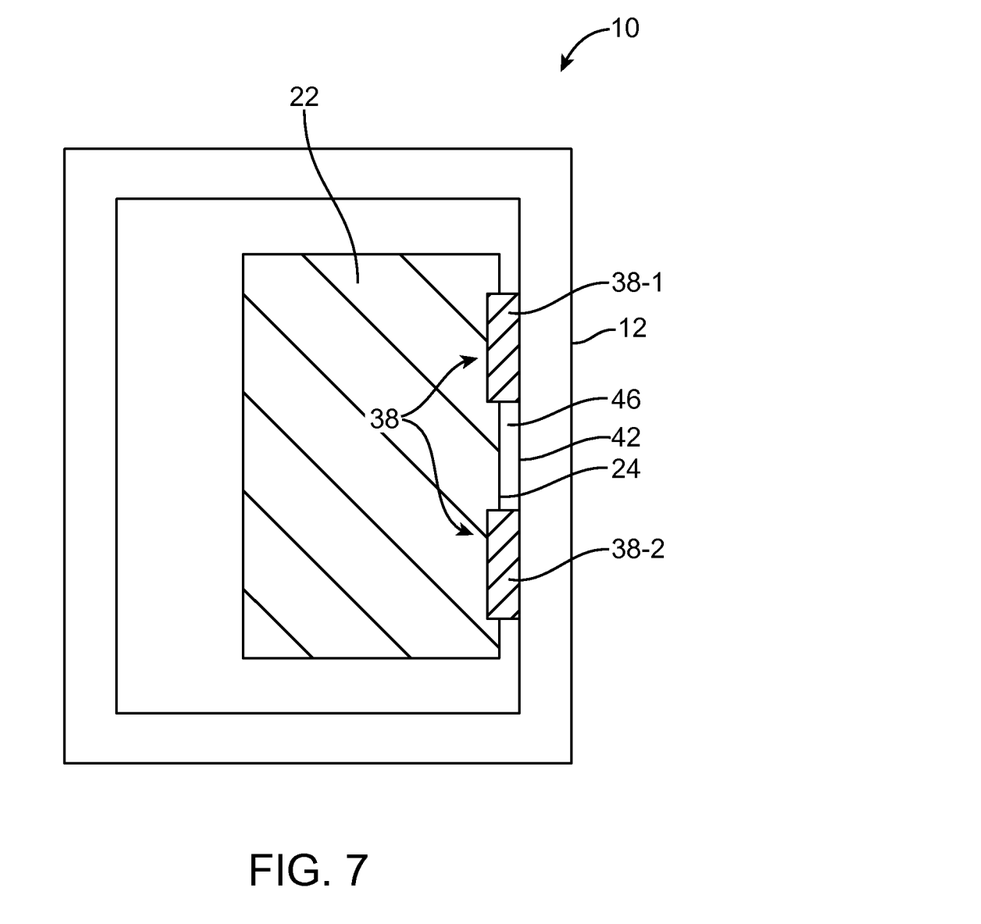
FIG. 7 is a top view of a printed circuit coupled to a housing wall using a pair of bumpers that are attached along an edge of the printed circuit in accordance with an embodiment of the present invention.

FIG. 7 is a top view of an interior portion of device 10 in an illustrative configuration in which thermally conductive bumper structures 38 have been implemented using two separate bumpers (38-1 and 38-2). Bumper structures 38-1 and 38-2 may each be interposed between edge 24 of printed circuit 22 and inner surface 42 of housing 12. Bumper structures 38 may bridge air gap 42, thereby providing a cushioning feature that helps prevent edge 24 from contacting surface 42 during drop events in which device 10 is subjected to sharp impacts. Bumpers such as bumpers 38-1 and 38-2 may have C-shaped cross sections, L-shaped cross sections, or other suitable cross-sectional shapes.

Printed circuit board 22 may have a rectangular periphery as shown in FIG. 7 (e.g., when viewed along the surface normal of the board as shown in FIG. 7), may have a periphery with one or more curved edges, may have a periphery with straight edges, or may have a periphery with a combination of straight and curved edges. The rectangular footprint for board 22 that is shown in FIG. 7 is merely illustrative.

Thermally conductive bumper members such as bumpers 38-1 and 38-2 may be located on one edge along the periphery of printed circuit board 22, along two or more edges of printed circuit board 22, along three or more peripheral edges of printed circuit board 22, or along four or more peripheral edges of printed circuit board 22. Each edge of printed circuit board 22 may, in general, be provided with no bumpers, one or more bumpers, two or more bumpers, three or more bumpers, or other suitable bumper structures.

Figure 8:
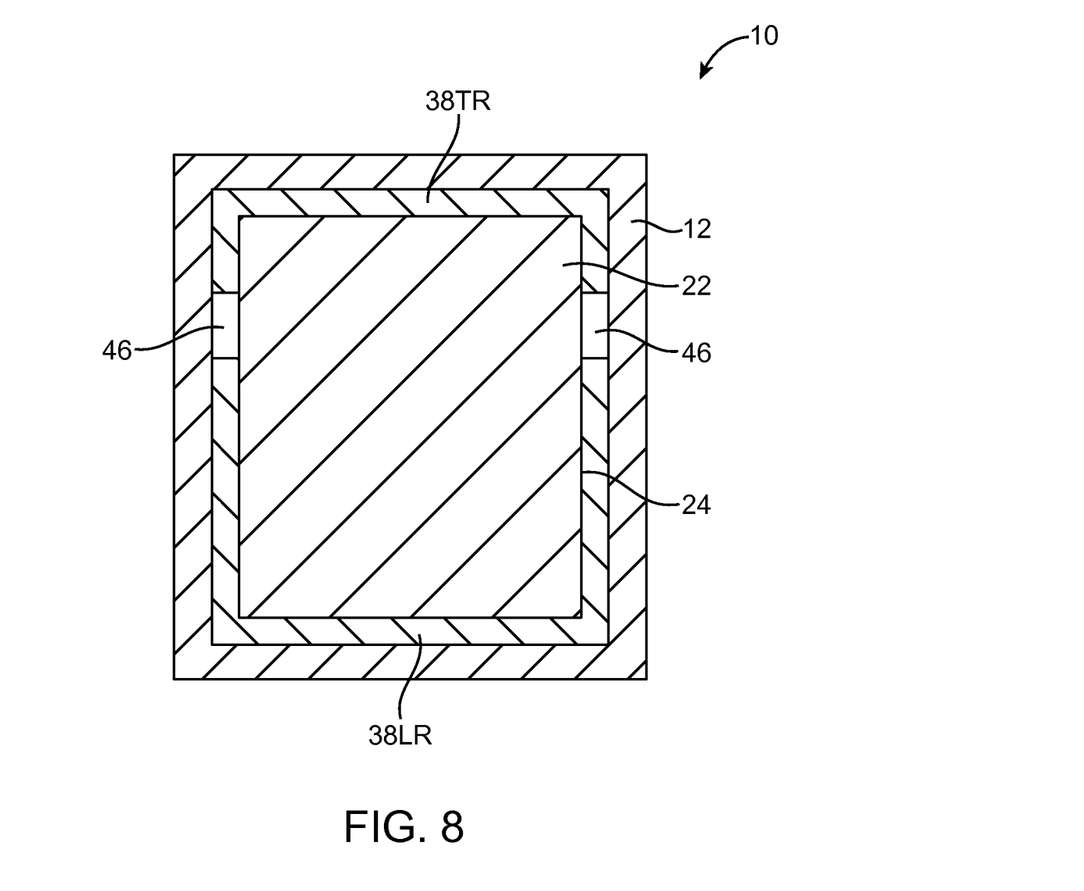
FIG. 8 is a top view of a printed circuit coupled to a housing wall using bumper structures that run around the periphery of the printed circuit in accordance with an embodiment of the present invention.

As shown in FIG. 8, printed circuit board 22 may have a rectangular periphery. Thermally conductive bumper structures 38 may include a first U-shaped bumper member such as bumper member 38TR and a second U-shaped bumper member such as bumper member 38LR. Bumper structures 38TR and 38LR may be formed from a rectangular ring-shaped bumper structure that is separated into two segments (members 38TR and 38LR) by air gaps 46.

Figure 9:
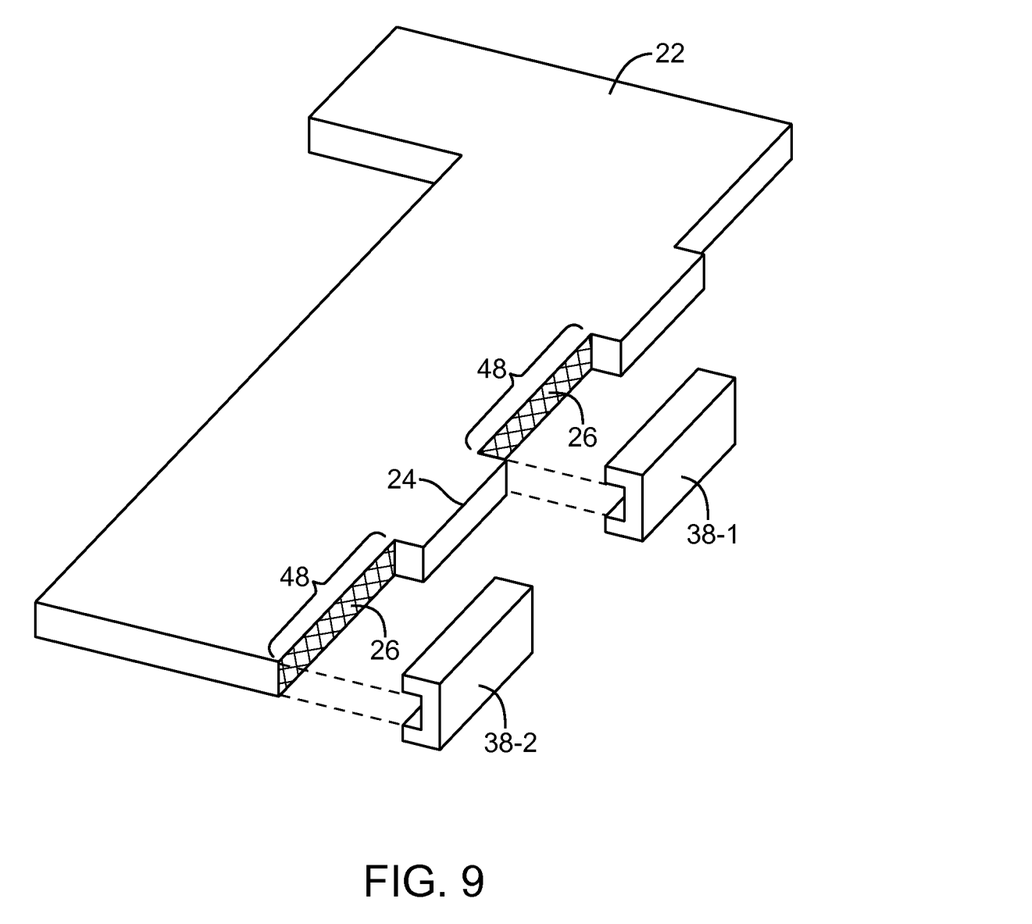
FIG. 9 is an exploded perspective view of an illustrative printed circuit with bumpers in accordance with an embodiment of the present invention.

FIG. 9 is an exploded perspective view of a printed circuit and associated bumper structures. As shown in FIG. 9, printed circuit board 22 may have an L-shaped footprint. Edge 24 may have recesses such as recesses 48. Bumper structures 38-1 and 38-2 may have C-shaped cross-sections that fit over edge metal layers 26 in recesses 48.

Figure 10:
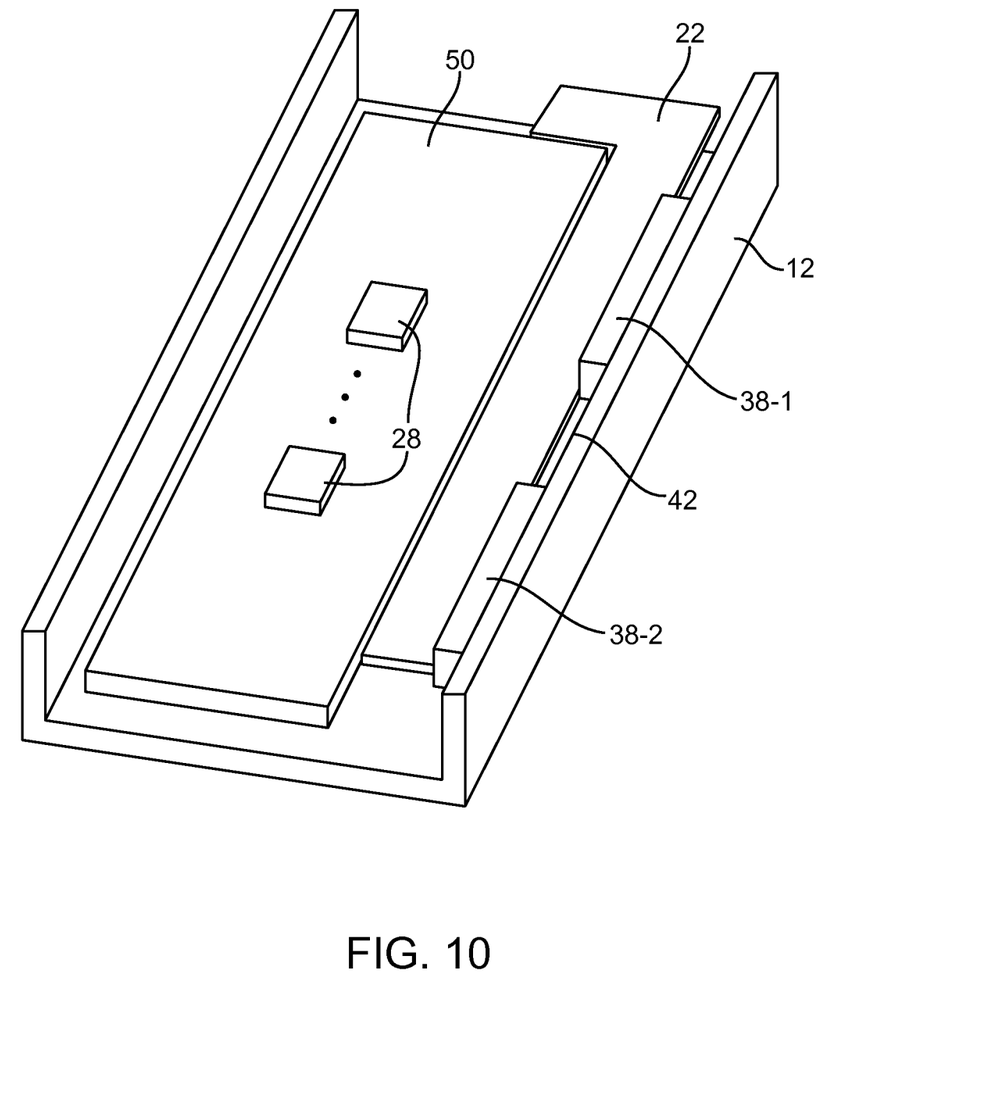
FIG. 10 is a perspective view of a printed circuit mounted within electronic device housing structures using bumper structures in accordance with an embodiment of the present invention.

FIG. 10 is a perspective view of an interior portion of device 10 showing how an electrical component such as battery 50 may be mounted adjacent to printed circuit board 22. If desired, other internal components in device 10 may be mounted adjacent to printed circuit board 22. The configuration of FIG. 10 is merely illustrative.

Printed circuit board 22 may have an L-shaped footprint and thermally conductive bumper structures 38-1 and 38-2 may have C-shaped cross sections that are received in recesses of the type shown in FIG. 9. When assembled into housing 12 as shown in FIG. 10, thermally conductive bumper structures 38-1 and 38-2 may help structurally cushion and isolate printed circuit board 22 from inner wall surface 42 of housing 12. Thermally conductive bumper structures 38-1 and 38-2 may also help conduct heat from components 28 to the thermally conductive wall structures of housing 12.

The foregoing is merely illustrative of the principles of this invention and various modifications can be made by those skilled in the art without departing from the scope and spirit of the invention. The foregoing embodiments may be implemented individually or in any combination.

What is claimed is:

1. Apparatus, comprising:
an electrical component;
a printed circuit board to which the electrical component is mounted;
a thermally conductive electronic device housing structure; and
thermally conductive elastomeric structures interposed between the printed circuit board and the thermally conductive electronic device housing structure to conduct heat from the electrical component to the thermally conductive electronic device housing structure, wherein the printed circuit board has an edge and wherein the thermally conductive elastomeric structures are interposed between the edge and the thermally conductive electronic device housing structure.

2. The apparatus defined in claim 1 further comprising a metal coating on the edge of the printed circuit board.

3. The apparatus defined in claim 2 wherein the thermally conductive electronic device housing structure comprises a metal housing wall.

4. The apparatus defined in claim 3 wherein the thermally conductive elastomeric structures comprise an elastomeric polymer with a thermally conductive additive.

5. The apparatus defined in claim 4 wherein the elastomeric polymer comprises silicone.

6. The apparatus defined in claim 4 wherein the elastomeric polymer has a Shore A hardness of less than 60.

7. The apparatus defined in claim 4 wherein the thermally conductive elastomeric structures are configured to exhibit a thermal conductivity of greater than 1 W/mK.

8. The apparatus defined in claim 1 wherein the printed circuit board has opposing first and second planar surfaces and has a metal trace on the first planar surface and wherein the thermally conductive elastomeric structures conduct heat from the metal trace to the thermally conductive electronic device housing structure.

9. Apparatus, comprising:
an electrical component;
a printed circuit board to which the electrical component is mounted;
a thermally conductive electronic device housing structure; and
thermally conductive elastomeric structures interposed between the printed circuit board and the thermally conductive electronic device housing structure to conduct heat from the electrical component to the thermally conductive electronic device housing structure, wherein the thermally conductive elastomeric structures comprise at least one elastomeric member with a C-shaped cross section.

10. The apparatus defined in claim 1, wherein the edge has at least one recess, wherein the edge has an edge surface covered with an edge surface metal layer, and wherein the thermally conductive elastomeric structures are configured to conduct heat from the edge surface metal layer to the thermally conductive housing structure.

11. An electronic device, comprising:
a printed circuit board that includes metal traces;
an integrated circuit mounted on the printed circuit board that generates heat that is conducted to the metal traces;
a thermally conductive housing structure; and
thermally conductive elastomeric bumper structures that are coupled between the printed circuit board and the thermally conductive housing structure to conduct heat from the metal traces to the thermally conductive housing structure, wherein the thermally conductive housing structure comprises a metal housing wall with an inner surface, wherein the metal traces include ground plane traces, wherein the printed circuit board includes an edge surface coated with a metal layer that contacts at least one of the ground plane traces, and wherein the thermally conductive elastomeric bumper structures contact the metal layer and contact the inner surface of the metal housing wall.

12. The electronic device defined in claim 11 wherein the thermally conductive elastomeric bumper structures comprise an elastomeric member with a C-shaped cross section.

13. The electronic device defined in claim 11 wherein the thermally conductive elastomeric bumper structures comprise thermally conductive silicone.

14. Apparatus, comprising:
an integrated circuit that generates heat;
a printed circuit to which the integrated circuit is mounted;
a metal electronic device housing structure; and
a thermally conductive elastomeric member that physically contacts the printed circuit and that physically contacts the metal electronic device housing member, wherein the printed circuit has opposing upper and lower surfaces and has an edge surface that is perpendicular to the upper and lower surfaces, wherein the printed circuit includes metal traces coupled to a metal layer on the edge surface, and wherein the thermally conductive elastomeric member is configured to conduct heat from the metal layer of the edge surface to the metal electronic device housing structure to cool the electrical component.

15. Apparatus, comprising:
an electrical component;
a printed circuit board to which the electrical component is mounted;
a thermally conductive electronic device housing structure; and
thermally conductive elastomeric structures interposed between the printed circuit board and the thermally conductive electronic device housing structure, wherein the thermally conductive elastomeric structures are in contact with more than one surface of the printed circuit board.

16. Apparatus, comprising:
an electrical component;
a printed circuit board to which the electrical component is mounted;
a thermally conductive electronic device housing structure; and
thermally conductive elastomeric structures interposed between the printed circuit board and the thermally conductive electronic device housing structure, wherein the thermally conductive elastomeric structures are in contact with more than one surface of the thermally conductive electronic device housing structure.

* * * * *